United States Patent
Martinis et al.

(10) Patent No.: US 12,207,407 B2
(45) Date of Patent: Jan. 21, 2025

(54) OVERLAP JOINT FLEX CIRCUIT BOARD INTERCONNECTION

(71) Applicant: Google LLC, Mountain View, CA (US)

(72) Inventors: John Martinis, Santa Barbara, CA (US); Bob Benjamin Buckley, Santa Barbara, CA (US); Xiaojun Trent Huang, Santa Barbara, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 18/355,199

(22) Filed: Jul. 19, 2023

(65) Prior Publication Data

US 2024/0049392 A1 Feb. 8, 2024

Related U.S. Application Data (63) Continuation of application No. 17/476,625, filed on Sep. 16, 2021, now Pat. No. 11,751,333.
(Continued)

(51) Int. Cl.
  *H05K 1/11* (2006.01)
  *H05K 1/02* (2006.01)
  (Continued)

(52) U.S. Cl.
  CPC ............ *H05K 1/144* (2013.01); *H05K 1/028* (2013.01); *H05K 1/115* (2013.01); *H05K 1/118* (2013.01);
  (Continued)

(58) Field of Classification Search
  CPC ........ H05K 1/144; H05K 1/028; H05K 1/115; H05K 1/118; H05K 1/147; H05K 1/0393;
  (Continued)

(56) References Cited

U.S. PATENT DOCUMENTS

| 6,930,240 B1 | 8/2005 | Giboney et al. |
| 9,348,377 B2 | 5/2016 | Dean et al. |

(Continued)

FOREIGN PATENT DOCUMENTS

| CN | 206452600 | 8/2017 |
| CN | 110933836 | 3/2020 |

(Continued)

OTHER PUBLICATIONS

WO2019050525 provided with Office Action (Year: 2019).*

(Continued)

*Primary Examiner* — Roshn K Varghese
(74) *Attorney, Agent, or Firm* — DORITY & MANNING P.A.

(57) ABSTRACT

An interconnection for flex circuit boards used, for instance, in a quantum computing system are provided. In one example, the interconnection can include a first flex circuit board having a first side and a second side opposite the first side. The interconnection can include a second flex circuit board having a third side and a fourth side opposite the third side. The first flex circuit board and the second flex circuit board are physically coupled together in an overlap joint in which a portion of the second side for the first flex circuit board overlaps a portion of the third side of the flex circuit board. The interconnection can include a signal pad structure positioned in the overlap joint that electrically couples a first via in the first flex circuit board and a second via in the second flex circuit board.

18 Claims, 6 Drawing Sheets

Related U.S. Application Data (60) Provisional application No. 63/079,274, filed on Sep. 16, 2020.

(51) Int. Cl.
  *H05K 1/14* (2006.01)
  *H05K 3/36* (2006.01)

(52) U.S. Cl.
  CPC ....... *H05K 3/363* (2013.01); *H05K 2201/041* (2013.01); *H05K 2201/0939* (2013.01); *H05K 2201/09481* (2013.01)

(58) Field of Classification Search
  CPC ....... H05K 1/0221–0225; H05K 1/189; H05K 2201/041; H05K 2201/0939; H05K 2201/09481; H05K 2201/0154; H05K 2201/058; H05K 2201/09327; H05K 2201/09809; H05K 2201/09427; H05K 2201/0949; H05K 3/363; H05K 3/361; G06N 10/40; G06N 10/80
  See application file for complete search history.

(56) References Cited

U.S. PATENT DOCUMENTS

| | | | |
|---|---|---|---|
| 9,515,402 | B1 | 12/2016 | Li et al. |
| 9,723,725 | B2 | 8/2017 | Shi |
| 9,991,616 | B2 | 6/2018 | Axelowitz et al. |
| 10,205,286 | B2 | 2/2019 | Provencher et al. |
| 10,687,415 | B2 | 6/2020 | Zhang et al. |
| 10,957,969 | B2 | 3/2021 | Pandya et al. |
| 11,245,171 | B2 | 2/2022 | Yosui |
| 11,557,709 | B2 | 1/2023 | Martinis |
| 2003/0174484 | A1 | 9/2003 | Pai et al. |
| 2004/0150970 | A1 | 8/2004 | Lee |
| 2010/0331738 | A1 | 12/2010 | Stein et al. |
| 2011/0024160 | A1 | 2/2011 | Quan et al. |
| 2013/0327621 | A1 | 12/2013 | Dinh et al. |
| 2014/0127916 | A1* | 5/2014 | Lee ................ H05K 1/0248 439/74 |
| 2015/0327368 | A1 | 11/2015 | Su et al. |
| 2016/0099227 | A1 | 4/2016 | Dalal et al. |
| 2017/0093059 | A1 | 3/2017 | Chen et al. |
| 2019/0043747 | A1 | 2/2019 | Malatkar et al. |
| 2020/0280117 | A1 | 9/2020 | Yosui |
| 2023/0130578 | A1 | 4/2023 | Martinis |

FOREIGN PATENT DOCUMENTS

| | | | |
|---|---|---|---|
| JP | H05299708 | 11/1993 | |
| JP | H05304224 | 11/1993 | |
| JP | H06523621 | 2/1994 | |
| JP | 2009/266846 | 11/2009 | |
| JP | 2009/266847 | 11/2009 | |
| WO | WO2018/213494 | 11/2018 | |
| WO | WO-2019050525 A1 * | 3/2019 | ........... H05K 1/0218 |

OTHER PUBLICATIONS

Search Report Corresponding to Application No. 2021800762408 on Oct. 12, 2023.

Chow et al., "Pressure Contact Micro-Springs in Small Pitch Flip-Chip Packages", IEEE Transactions on Components and Packaging Technologies, vol. 29, No. 4, pp. 796-803.

International Preliminary Report on Patentability for Application No. PCT/US2021/050639, mailed Mar. 30, 2023, 8 pages.

International Search Report and Written Opinion for Application No. PCT/US2021/050639, mailed Jan. 3, 2022, 13 pages.

Laird.com, "Flexible Foam Sheet Broadband Microwave Absorber", http://www.laird.com/sites/default/files/2021-01/RFP-DS-AN%2006242020.pdf, retrieved on Jan. 19, 2022, 2 pages.

Shubin et al., "Novel Packaging with Rematable Spring Interconnect Chips for MCM", 59$^{th}$ Electronic Components and Technology Conference, May 26-29, 2009, San Diego, California, 7 pages.

* cited by examiner

OVERLAP JOINT FLEX CIRCUIT BOARD INTERCONNECTION

PRIORITY CLAIM

The present application is a continuation of U.S. application Ser. No. 17/476,625 having a filing date of Sep. 16, 2021 which claims the benefit of priority of U.S. Provisional Application Ser. No. 63/079,274, filed Sep. 16, 2020, titled Overlap Joint Flex Circuit Board Interconnection. Applicant claims priority to and the benefit of each of such applications and incorporate all such applications herein by reference in its entirety.

FIELD

The present disclosure relates generally to interconnections for, for instance, classical or quantum computing systems.

BACKGROUND

Quantum computing is a computing method that takes advantage of quantum effects, such as superposition of basis states and entanglement, to perform certain computations more efficiently than a classical digital computer. In contrast to a digital computer, which stores and manipulates information in the form of bits, e.g., a "1" or "0," quantum computing systems can manipulate information using quantum bits ("qubits"). A qubit can refer to a quantum device that enables the superposition of multiple states, e.g., data in both the "0" and "1" state, and/or to the superposition of data, itself, in the multiple states. In accordance with conventional terminology, the superposition of a "0" and "1" state in a quantum system may be represented, e.g., as a $|0\rangle + b |1\rangle$. The "0" and "1" states of a digital computer are analogous to the $|0\rangle$ and $|1\rangle$ basis states, respectively of a qubit.

SUMMARY

Aspects and advantages of embodiments of the present disclosure will be set forth in part in the following description, or can be learned from the description, or can be learned through practice of the embodiments.

One example aspect of the present disclosure is directed to an interconnection for connecting a plurality of flex circuit boards. The interconnection can include a first flex circuit board having a first side and a second side opposite the first side. The interconnection can include a second flex circuit board having a third side and a fourth side opposite the third side. The first flex circuit board and the second flex circuit board are physically coupled together in an overlap joint in which a portion of the second side for the first flex circuit board overlaps a portion of the third side of the flex circuit board. The interconnection can include a signal pad structure positioned in the overlap joint that electrically couples a first via in the first flex circuit board and a second via in the second flex circuit board.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

BRIEF DESCRIPTION OF THE DRAWINGS

Detailed discussion of embodiments directed to one of ordinary skill in the art is set forth in the specification, which refers to the appended figures, in which.

DETAILED DESCRIPTION

Example aspects of the present disclosure are directed to making and using specialized overlap joint interconnections that can connect various types of circuit boards including, but not limited to, flexible and semi-flexible circuit boards used in traditional computing systems, quantum computing systems, and other types of electronics (e.g., automobiles, aircraft, satellites, medical devices, smartphones, wearable devices, etc.). A circuit board generally refers to a piece of material with printed or integrated circuits, which is used to connect electronic components and devices. Flex circuit boards can include circuit boards that provide at least some structural flexibility in whole or in part.

Flex circuit boards may be used in a variety of electronics, for example, where flexibility and space savings would be difficult or impossible to achieve with rigid circuit boards. While flex circuit boards can have advantages over rigid circuit boards, connecting flex circuit boards can be problematic. For example, the inherent pliability of flex circuit boards presents an increased risk of damage during handling and use due to movement and reduced structural support. In addition, the repair or replacement of damaged flex circuit boards can be inconvenient and expensive. As such, the present disclosure describes new and improved ways of making and using overlap joints that interconnect flex circuit board.

According to example aspects of the present disclosure, an overlap interconnection for interconnecting multiple circuit boards, such as flex circuit boards can include, for instance, a first flex circuit board having a first side and a second side opposite the first side. The interconnection can include a second flex circuit board having a third side and a fourth side opposite the third side. The first flex circuit board and the second flex circuit board can be physically coupled to each other in an overlap joint in which a portion of the second side of the first flex circuit board overlaps a portion of the third side of the flex circuit board.

The first flex circuit board can include a first signal line, a first dielectric layer, and a first via. The first via can extend through the first dielectric layer at least from the first signal line to the second side of the first flex circuit board. The second flex circuit board can include a second signal line, a second dielectric layer, and a second via. The second via can extend through the second dielectric layer at least from the second signal line to the third side of the second flex circuit board. The interconnection further includes a signal pad structure positioned in the overlap joint between the second side of the first flex circuit board and the third side of the second flex circuit board and electrically coupled to the first via and the second via.

Example aspects of the present disclosure also are directed to methods of producing wiring structures for interconnecting various types of circuit boards in, for example, computing systems, quantum computing systems, and different types of electronics (e.g., automobiles, aircraft, satellites, medical devices, smartphones, wearable devices, etc.). A method may include, for example, obtaining a first circuit board, obtaining a second circuit board, aligning the first circuit board and the second circuit board such that a signal pad structure is positioned in an overlap joint between the second side of the first circuit board and the third side of the second circuit board, and coupling at least a first via in the first flex circuit board and via second via in the second flex circuit board at the signal pad structure.

Aspects of the present disclosure provide a number of technical effects and benefits. For instance, the various examples of the interconnections described in the present disclosure provide increased reinforcement and durability when interconnecting flex circuit boards, which may flex, bend, and contort to fit a final assembly. For example, the flex circuit board interconnections described herein protect against and reduce the likelihood of damage during installation, deployment, use, and maintenance of various types of traditional computing systems, quantum computing systems, consumer devices, industrial equipment, aerospace equipment, etc. As such, these new and improved flex circuit board interconnections provide greater dependability and resiliency when compared to traditional interconnections, thereby reducing damage, repair, replacement, downtime, and costs associated with various types of systems, devices, and equipment using flex circuit boards.

As used herein, a "flex circuit board" refers to a board including at least one generally planar substrate (e.g., layered substrates) or other support on which the one or more signal lines are formed or otherwise disposed and having flexibility in at least one plane. Flexibility refers to the ability to be deformed without breaking. For example, a rectangular flex circuit board may be flexible along the largest surface of the rectangular flex circuit board. A rectangular flex circuit board may be flexible and/or rigid along at least a portion of its edges. The flexibility may be achieved as a property of material(s) from which the flex circuit board and/or layers of the flex circuit board is/are formed (e.g., metals, such as copper, copper alloys, niobium, aluminum, etc., dielectric materials, nonmetals, polymers, rubbers, etc.), achieved by hinging and/or segmenting of the flex circuit board (e.g., hinging and/or segmenting a rigid portion), and/or in any other suitable manner. The substrate(s) may be strictly planar (e.g., having a substantially linear cross-section across a length and width) and/or may be generally planar in that the substrate(s) bend, wrinkle, or are otherwise non-linear in at least one cross-section but generally represent a shape having a depth significantly less than (e.g., less than about 10% of) a length and width.

As used herein, the use of the term "about" or "approximately" in conjunction with a stated numerical value is intended to refer to within 10% of the stated numerical value.

With reference now to the Figures, example embodiments of the present disclosure will be discussed in further detail. Aspects of the present disclosure are discussed with referenced to interconnections for flex circuit boards in quantum computing systems for purposes of illustration and discussion. Those of ordinary skill in the art, using the disclosures provided herein, will understand that the interconnection can be used in other applications without deviating from the scope of the present disclosure.

Figure 1:
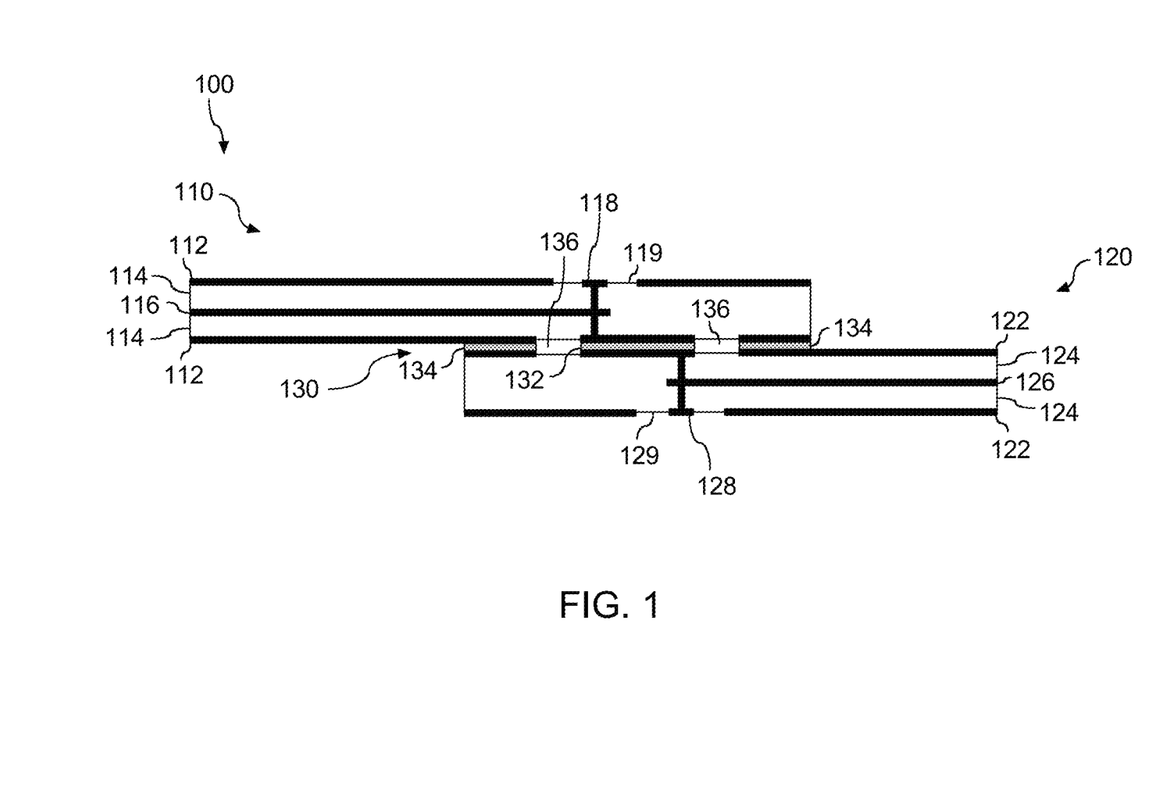
FIG. 1 depicts a diagram of an example flex circuit board interconnection according to example aspects of the present disclosure.

FIG. 1 depicts a cross-sectional view of an example overlap joint flex-flex interconnect 100 according to example embodiments of the present disclosure. The overlap joint interconnect 100 can be used for interconnecting multiple flex circuit boards. The overlap joint interconnect 100 can be made between a first flex circuit board 110 and a second flex circuit board 120. The first flex circuit board 110 can include ground layer(s) 112, dielectric layer(s) 114, and/or signal line(s) 116. Similarly, the second flex circuit board 120 can include ground layer(s) 122, dielectric layer(s) 124, and/or signal line(s) 126. The first flex circuit board 110 and the second flex circuit board 120 may include the same materials and/or different materials.

The first flex circuit board 110 can include at least one via 118 extending through the dielectric layer 114 from the signal line 116 to a second side of the first flex circuit board (e.g., a side having the ground layer 112). For example, the via 118 can be a same material as the signal line 116 (e.g., superconducting material) and/or may be different material. The via 118 can be surrounded by gap 119. For example, gap 119 may be circular on a surface having the ground layer 112. In some embodiments, such as illustrated in FIG. 1, the via 118 can extend through both dielectric layers 114. For example, the via 118 can be a so-called "through via" that extends from a first surface of the first flex circuit board 110 to a second surface of the first flex circuit board 110. Additionally and/or alternatively, the via 118 can be a so-called "blind via" that extends from the signal line 116 to only one side of the first flex circuit board 110 (e.g., to signal pad 132).

The second flex circuit board 120 can additionally include at least one via 128 extending through the dielectric layer 124 from the signal line 126 to a second side of the second flex circuit board (e.g., a side having the ground layer 122). For example, the via 128 can be a same material as the signal line 126 (e.g., superconducting material) and/or may be different material. The via 128 can be surrounded by gap 129. For example, gap 129 may be circular on a surface having the ground layer 122. In some embodiments, the via 128 can extend through both dielectric layers 124. In some embodiments, such as illustrated in FIG. 1, the via 128 can extend through both dielectric layers 124. For example, the via 128 can be a so-called "through via" that extends from a first surface of the second flex circuit board 120 to a second surface of the second flex circuit board 120. Additionally and/or alternatively, the via 128 can be a so-called "blind via" that extends from the signal line 126 to only one side of the second flex circuit board 120 (e.g., to signal pad 132).

The overlap joint flex-flex interconnect 100 can include overlap joint 130. For instance, overlap joint 130 can be formed at an overlap of first flex circuit board 110 and second flex circuit board 120. In some embodiments, the first flex circuit board 120 and the second flex circuit board 120 can overlap by about 3 mm to about 7 mm.

The overlap joint 130 can include at least signal pad 132. Signal pad 132 can be configured to couple signal line 116 (e.g., by via 118) of the first flex circuit board 110 to signal line 126 (e.g., by via 128) of the second flex circuit board 120. The signal pad 132 can facilitate signal transfer between the first flex circuit board 110 and the second flex circuit board 120. Additionally, the overlap joint 130 can include one or more ground pads 134. A ground pad 134 can couple a ground layer 112 of the first flex circuit board 110 to a mated ground layer 122 of the second flex circuit board 122. For example, the ground pad 134 can place the ground layers 112 and 122 in electrical communication. One or more gaps 136 can be provided between the signal pad 132 and the ground pad(s) 134 to isolate the signal pad 132 from the ground pad(s) 134. In some embodiments, the signal pad 132, ground pad 134, and/or gaps 136 can be designed for impedance matching for transmitted signals.

Figure 2:
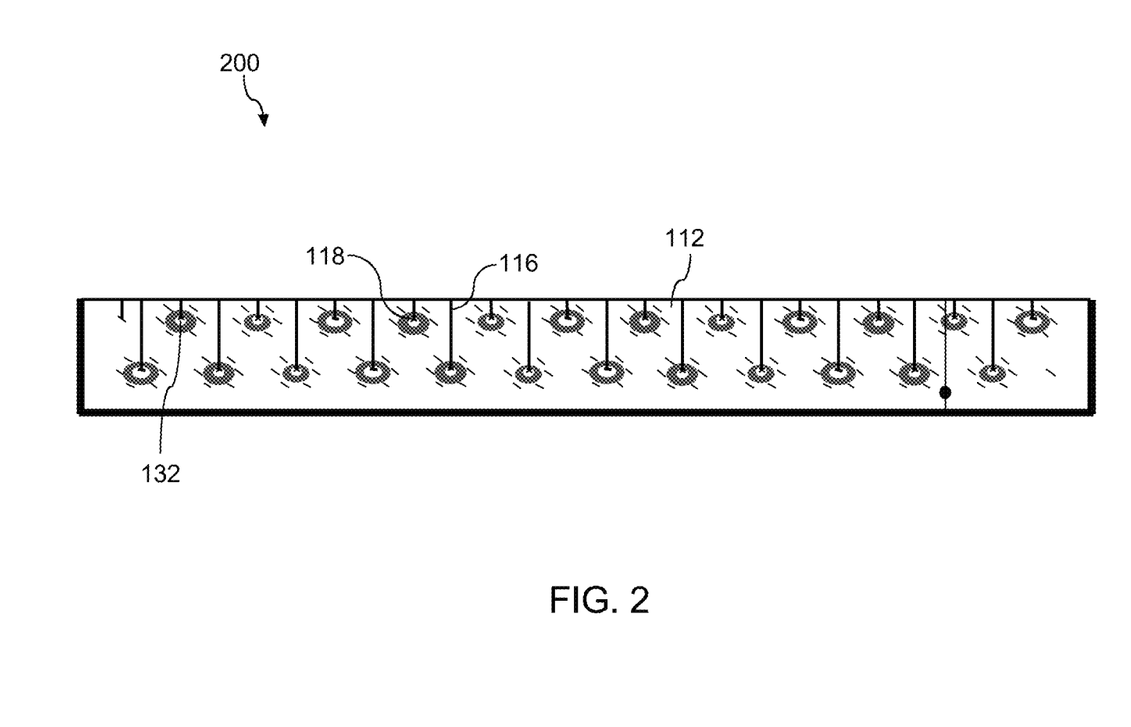
FIG. 2 depicts an illustration showing a top view of an example flex circuit interconnection according to example aspects of the present disclosure.

FIG. 2 depicts an illustration showing a top view of an example flex circuit board 200 to be used in overlap joint interconnection according to example aspects of the present disclosure. The flex circuit board 200 can include a ground layer(s) 112, signal line(s) 116, via(s) 118, circular signal pad(s) 132, and ground pads 134 surrounding the circular signal pad(s) 132. The top view illustration shows a series of signal lines 116, vias 118, and circular signal pads 132 that are all surrounded by the ground layer(s) 112. Circular signal pad(s) 132 can have a circular structure. The vias 118 can be connected to the signal lines 116 such that a signal passing through the signal lines 116 can be propagated through the vias 118. More particularly, the exposed signal pad(s) 132 and ground pads 134 can be coupled to a mirror-matched mate of a second flex circuit board to form the overlap interconnection. More particularly, the first flex circuit board can mirror the second flex circuit board.

Figure 3:
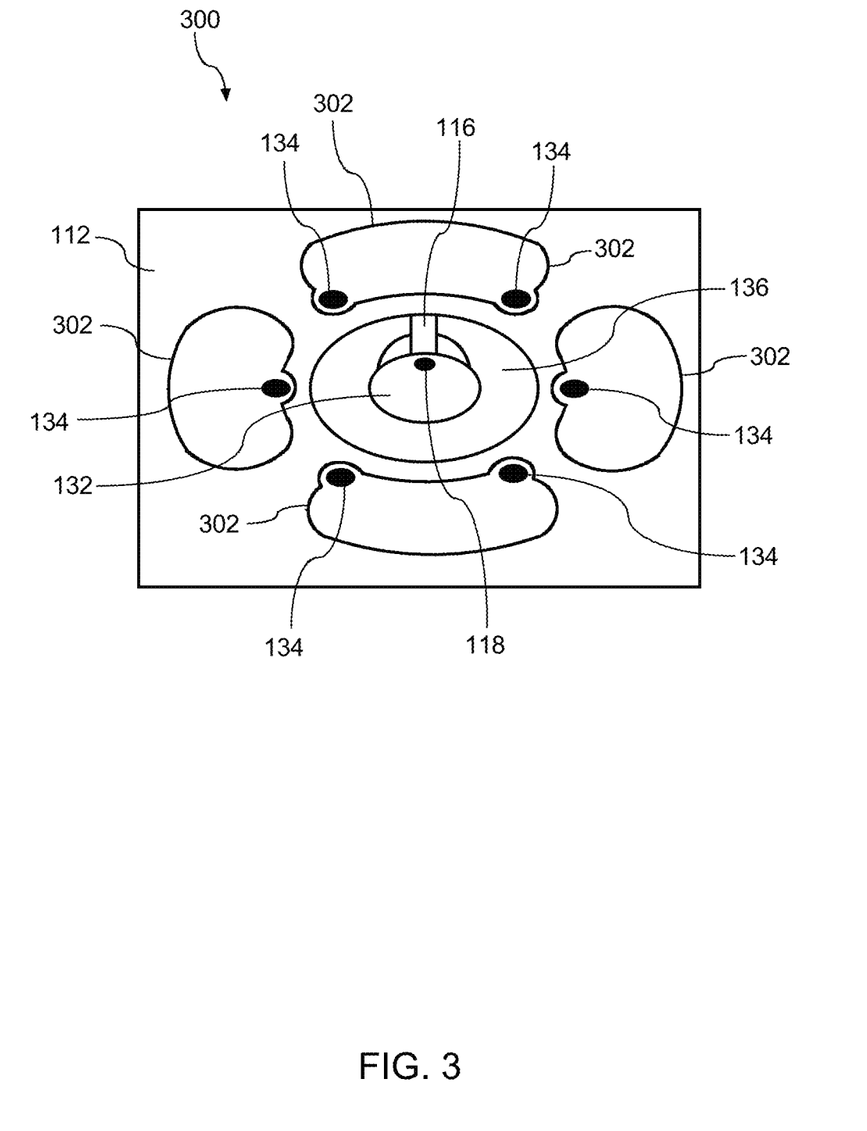
FIG. 3 depicts an illustration showing example solder placement of an example interconnection according to example aspects of the present disclosure.

FIG. 3 depicts a close up view of an example via 118 associated with a signal line 116 of a flex circuit board 300 to be used in an overlap joint interconnection according to example embodiments of the present disclosure. As shown, the flex circuit board 300 includes ground layer(s) 112, signal line 116, via 118, a circular signal pad 132, and ground pads 134 disposed at least partially around the circular signal pad 134. A gap 136 is formed between the circular signal pad 132 and the ground layer 112. Solder 302 can be used to couple ground pads 134 together and to matching ground pads of a flex circuit board to be interconnected with flex circuit board 300 in an overlap joint interconnection. Similarly, solder 304 can be used to couple circular signal pad 132 to a matching signal pad of a flex circuit board to be interconnected with the flex circuit board 300 in an overlap connection.

Figure 4:
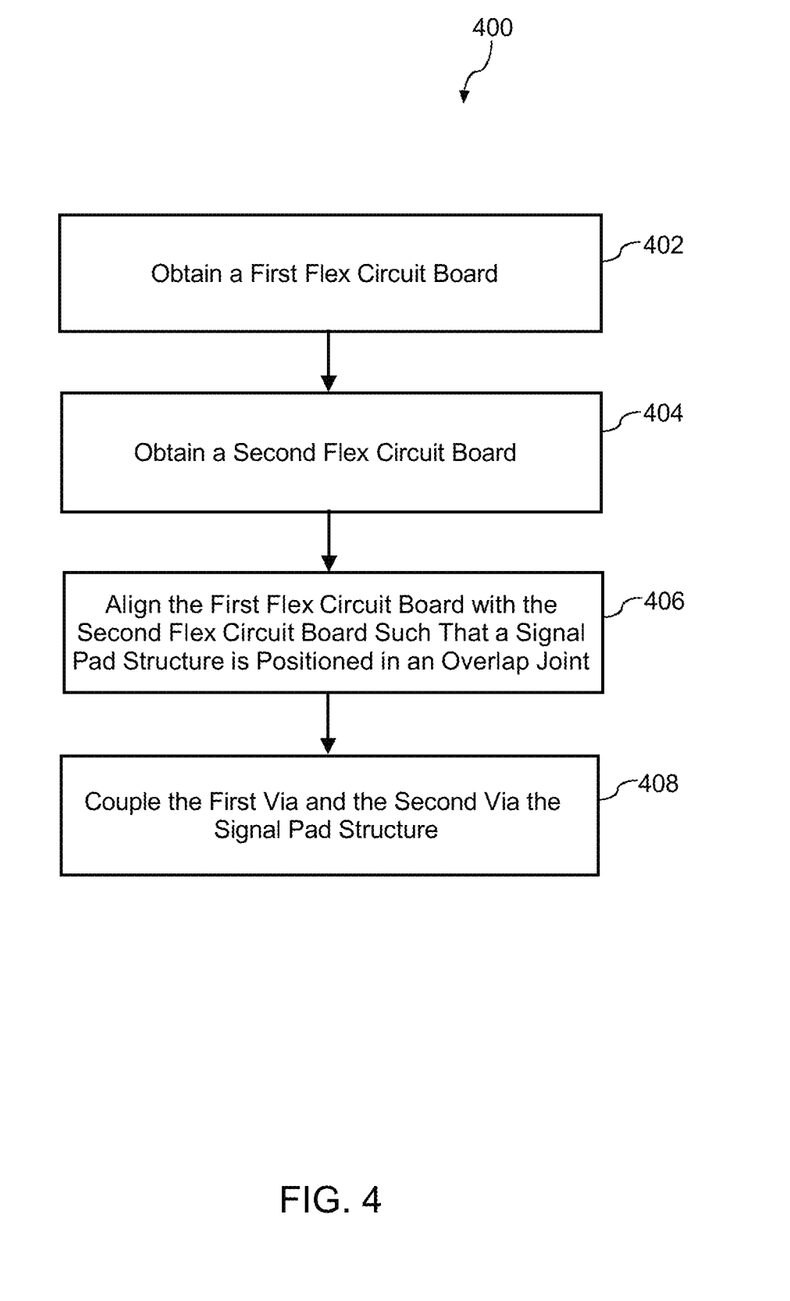
FIG. 4 depicts a flow diagram of an example method for producing an interconnection according to example aspects of the present disclosure.

FIG. 4 depicts a flow diagram of an example method 400 for producing an interconnection according to examples of the present disclosure. Although FIG. 4 depicts steps performed in a particular order for purposes of illustration and discussion as an example, the methods of the present disclosure are not limited to the particularly illustrated order or arrangement. As such, the various steps of the method 400 can be omitted, rearranged, combined, and/or adapted in various ways without deviating from the scope of the present disclosure.

At 402, a first flex circuit board is obtained. For example, first flex circuit board may comprise first and second ground layers, first and second dielectric layers, and/or signal line(s). In some examples, first flex circuit board can include at least one via extending through the dielectric layer from the signal line (e.g., to a second side of the first flex circuit board). For example, the via can be a same material as the signal line (e.g., superconducting material) and/or may be different material.

At 404, a second flex circuit board is obtained. For example, the second flex circuit board respectively may comprise a first and second ground layers, a first and second dielectric layers, and/or signal line(s). In some examples, second flex circuit board can include at least one via extending through the dielectric layer from the signal line (e.g., to a second side of the second flex circuit board). For example, the via can be a same material as the signal line (e.g., superconducting material) and/or may be different material.

At 406, the first flex circuit board and the second flex circuit board are aligned such that a signal pad structure is positioned in an overlap joint. In an example, a side or edge of a first flex circuit board is aligned with a side or edge of a second flex circuit board so that the signal pad structures face one another, for example, from opposite sides in a symmetrical or substantially symmetrical manner. In some examples, heated assembly jigs may be used, for example to align first flex circuit board with second flex circuit board and to perform various steps of assembling flex circuit overlap joint.

In some examples, first flex circuit board and second flex circuit board are laterally aligned and converge or overlap one another based on an alignment that forms an overlap between the signal pad structures of different flex circuit boards. In some examples, exposed via(s) of first flex circuit board are in contact with exposed via(s) of second flex circuit board.

At 408, the first via and the second via are coupled to one another in the overlap joint by the signal pad structure. In an example, the first and second via are coupled by solder. The solder connection can create connectivity between the first via and the second via. In addition, the ground layer of the first flex circuit board can be coupled to the ground layer of the second flex circuit board by coupling ground pad(s). In an example, the ground pads are coupled via a solder connection.

Figure 5:
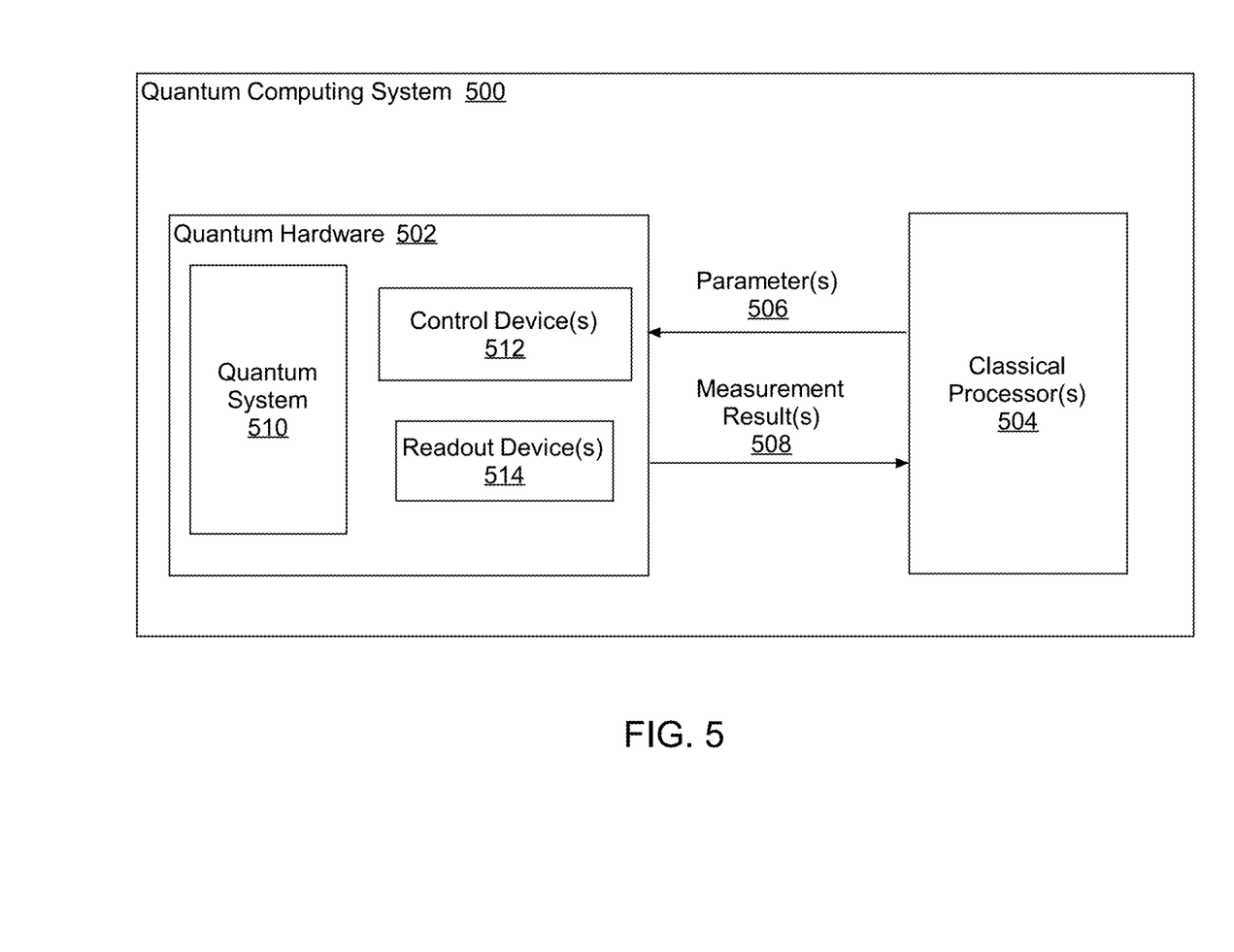
FIG. 5 depicts a quantum computing system according to example embodiments of the present disclosure.

FIG. 5 depicts a block diagram of an example quantum computing system according to examples of the present disclosure. Quantum computing system 500 is an example of a system implemented as a classical or quantum computer program on one or more classical computers or quantum computing devices in one or more locations, in which the systems, components, and techniques described in the present disclosure can be implemented. Quantum computing system 500 is an example that can be used to implement aspects of the present disclosure. Those of ordinary skill in the art, using the examples provided herein, will understand that other quantum computing structures or systems can be used without deviating from the scope of the present disclosure.

Quantum computing system 500 includes quantum hardware 502 in data communication with one or more classical processor(s) 504. For instance, quantum hardware 502 can represent and/or manipulate information using qubits. A qubit can be or include any suitable quantum device that enables the superposition of multiple states, e.g., data in both the "0" and "1" state. As one example, a qubit can be or include a unit of superconducting material, such as superconducting material that achieves superconductivity in temperatures below about 10 mK.

Quantum hardware 502 can include components for performing quantum computation. For example, quantum hardware 502 can include a quantum system 510, control device(s) 512, and readout device(s) (e.g., readout resonator(s) 514). Quantum system 510 can include one or more multi-level quantum subsystems, such as a register of qubits. In some implementations, the multi-level quantum subsystems can include superconducting qubits, such as flux qubits, charge qubits, transmon qubits, gmon qubits, etc.

Classical processor(s) 504 can be binary processors, such as processors that operate on data represented as a plurality of bits. As one example, bits can be represented by a voltage differential between a low voltage (e.g., 0V) and a high voltage (e.g., 5V) at a point of reference, such as a memory cell, circuit node, etc. The low voltage can be associated with a "0" state and the high voltage can be associated with a "1" state. Classical processor(s) 504 can be configured to, in addition to any other suitable function(s) of classical processor(s) 504, control quantum hardware 502. For instance, classical processor(s) 504 can be coupled to quantum hardware 502 (e.g., by signal lines) and/or configured to send control signals to perform quantum operations using quantum hardware 502. As one example, classical processor(s) 504 can be configured to send control signals that implement quantum gate operations at quantum hardware 502 (e.g., by control device(s) 512). Additionally and/or alternatively, classical processor(s) 504 can be configured to send control signals that cause quantum hardware 502 to perform quantum state measurements and/or provide the quantum state measurements to classical processor(s) 504 (e.g., by readout device(s) such as readout resonator(s) 514). For example, classical processor(s) 504 can receive measurements of the quantum system 510 that can be interpretable by classical processor(s) 504.

The type of multi-level quantum subsystems that quantum computing system 500 utilizes may vary. For example, in some cases it may be convenient to include one or more readout device(s) (e.g., readout resonator(s) 514) attached to one or more superconducting qubits, e.g., transmon, flux, gmon, xmon, or other qubits.

Quantum circuits may be constructed and applied to the register of qubits included in the quantum system 510 via multiple signal lines (e.g., signal line(s) 116, 126 of FIG. 1) that are coupled to one or more control devices 512. Example control devices 512 that operate on the register of qubits can be used to implement quantum logic gates or circuits of quantum logic gates, e.g., Hadamard gates, controlled-NOT (CNOT) gates, controlled-phase gates, T gates, multi-qubit quantum gates, coupler quantum gates, etc. One or more control devices 512 may be configured to operate on quantum system 510 through one or more respective control parameters (e.g., one or more physical control parameters 506). For example, in some implementations, the multi-level quantum subsystems may be superconducting qubits and control devices 512 may be configured to provide control pulses to control lines (e.g., signal line(s) 116, 126 of FIG. 1) to generate magnetic fields to adjust a frequency of the qubits.

Quantum hardware 502 may further include readout devices (e.g., readout resonators 514). Measurement results 508 obtained via measurement devices may be provided to the classical processors 504 for processing and analyzing. In some examples, quantum hardware 502 may include a quantum circuit and control device(s) 512, and readout devices may implement one or more quantum logic gates that operate on quantum system 510 through physical control parameters (e.g., microwave pulse) that are sent through wires included in quantum hardware 502. Further examples of control devices include arbitrary waveform generators, wherein a DAC creates the signal.

Readout device(s) (e.g., readout resonator(s) 514) may be configured to perform quantum measurements on quantum system 510 and send (e.g., by signal line(s) 116, 126 of FIG. 1) measurement results 508 to classical processor(s) 504. In addition, quantum hardware 502 may be configured to receive data (e.g., by signal line(s) 116, 126 of FIG. 1) specifying values of physical control parameter(s) 506 from classical processor(s) 504. Quantum hardware 502 may use the received values of physical control parameter(s) 506 to update the action of control device(s) 512 and readout devices(s) (e.g., readout resonator(s) 514) on quantum system 510. For example, quantum hardware 502 may receive data specifying new values representing voltage strengths of one or more DACs included in control device(s) 512 and may update the action of the DACs on quantum system 510 accordingly. Classical processor(s) 504 may be configured to initialize quantum system 510 in an initial quantum state, for example, by sending data to quantum hardware 502 specifying an initial set of parameters 506.

Readout device(s) (e.g., readout resonator(s) 514) can take advantage of a difference in the impedance for the $|0\rangle$ and $|1\rangle$ states of an element of quantum system 510, such as a qubit, to measure the state of the element (e.g., the qubit). For example, the resonance frequency of a readout resonator 514 can take on different values when a qubit is in the state $|0\rangle$ or the state $|1\rangle$, due to the nonlinearity of the qubit. Therefore, a microwave pulse reflected from a readout device (e.g., readout resonator 514) carries an amplitude and phase shift that depends on the qubit state. In some examples, a Purcell filter can be used in conjunction with readout device(s) (e.g., readout resonator(s) 514) to impede microwave propagation at the qubit frequency.

Quantum computing system 500 includes control device(s) 512. Control device(s) 512 can operate the quantum hardware 502. For example, control device(s) 512 can include a waveform generator configured to generate control pulses according to example aspects of the present disclosure.

In some examples, control device(s) 512 may include a data processing apparatus and associated memory. The memory may include a computer program having instructions that, when executed by a data processing apparatus, cause the data processing apparatus to perform one or more operations, such as applying a control signal to a qubit and/or to a tunable coupler.

Quantum hardware 502, such as, but not limited to, quantum system 510, control device(s) 512, readout device(s) 514, and/or any other suitable components of quantum hardware 502, can be located within a cryogenic cooling system (not shown). Additionally and/or alternatively, classical processor(s) 504 can be located outside a cryogenic cooling system. For instance, a cryogenic cooling system can be configured to cool quantum hardware 502. Additionally and/or alternatively, classical processor(s) 504 are not cooled by cryogenic cooling system. For instance, classical processor(s) 504 can operate at temperatures around room temperature (e.g., around 300 Kelvin) and/or temperatures around about 100 Kelvin, whereas quantum hardware 502 can operate at temperatures around absolute zero (e.g., less than about 1 Kelvin), which may require cooling by a cryogenic cooling system to operate effectively.

Quantum computing system 500 can include signal lines (not shown). The signal lines can couple classical processor(s) 504 to quantum hardware 502. For instance, as classical processor(s) 504 and quantum hardware 502 can be in signal communication, such as to transmit parameter(s) 506 and/or measurement result(s) 508 and/or any other suitable signals, classical processor(s) 504 can be coupled to quantum hardware 502 by signal lines. For instance, signal lines can be or can include any suitable physical communicative coupling(s) (e.g., one or more wires) configured to couple quantum hardware 502 and classical processor(s) 504. Generally, signal lines may include physical connections to allow for faster and/or more robust communication between quantum hardware 502 and classical processor(s)

504. Further, signal lines can be at least partially located in a cryogenic cooling system, for example, to provide coupling to quantum hardware 502.

Figure 6:
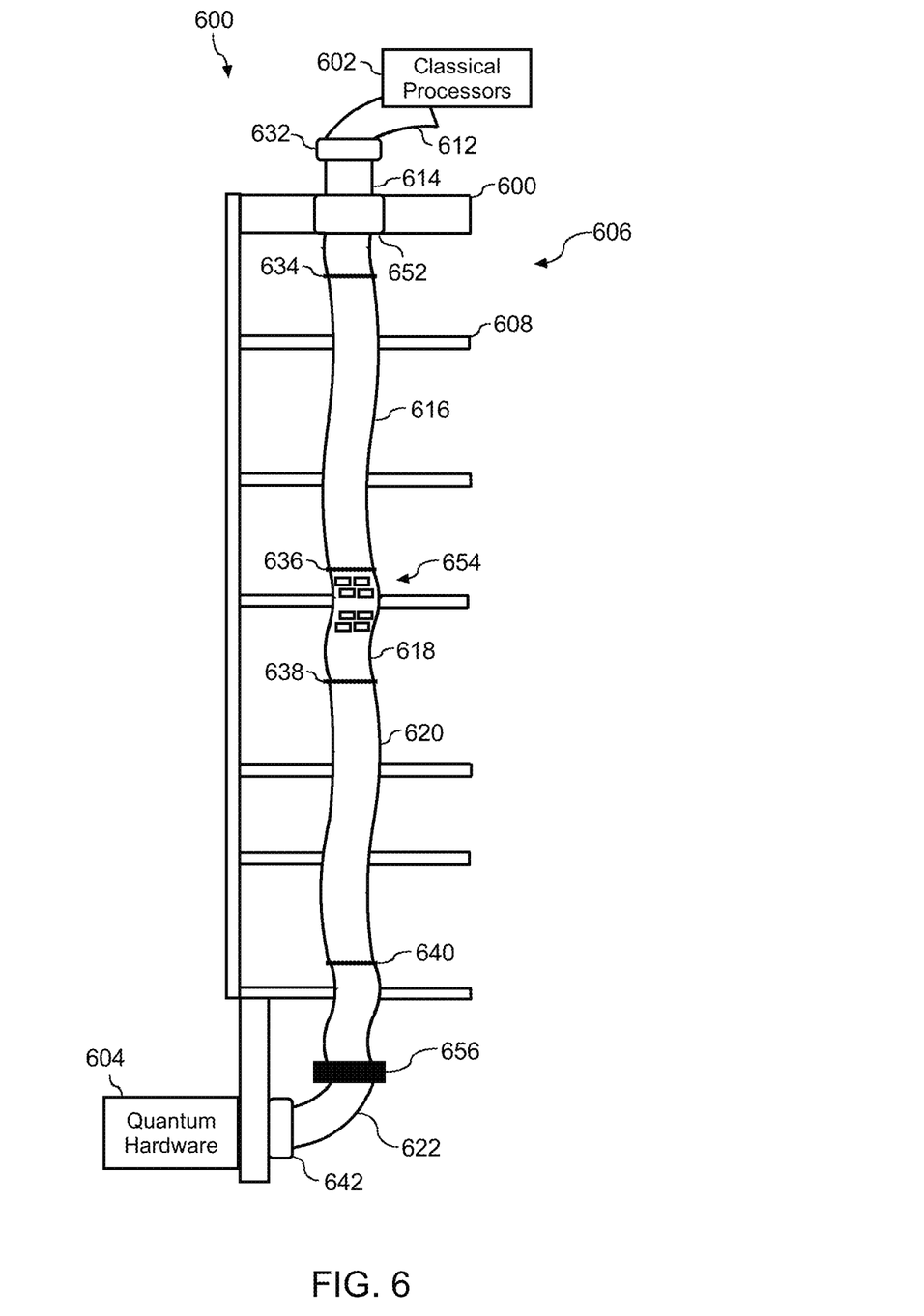
FIG. 6 depicts a quantum computing system according to example embodiments of the present disclosure.

FIG. 6 depicts an example quantum computing system 600 according to example embodiments of the present disclosure. The quantum computing system 600 can include one or more classical processors 602 and quantum hardware 604 including one or more qubits. The quantum computing system 600 can include a chamber mount 608 configured to support the quantum hardware 604 and a vacuum chamber configured to receive the chamber mount 608 and dispose the quantum hardware 604 in a vacuum. The vacuum chamber can form a cooling gradient from an end of the vacuum chamber (e.g., cap 607) to the quantum hardware 604. For example, the vacuum chamber can form a cooling gradient from a first temperature, such as room temperature (e.g., about 300 Kelvin) to a second temperature, such as at or about absolute zero (e.g., about 20 milliKelvin), such as to provide a temperature at the quantum hardware 604 at which the qubits experience superconductivity. In some embodiments, the cooling gradient can be formed by a plurality of cooling stages having progressively increasing and/or decreasing temperatures. As one example, the cooling stages can be stages of a staged cryogenic cooling system, such as a dilution refrigerator.

The quantum computing system 600 can include one or more signal lines between the classical processor(s) 602 and quantum hardware 604. According to example aspects of the present disclosure, the quantum computing system 600 can include one or more flex circuit boards 606 including one or more signal lines. The flex circuit board(s) 606 can be configured to transmit signals by the one or more signal lines through the vacuum chamber to couple the one or more classical processors 602 to the quantum hardware 604. The flex circuit board(s) 606 can include a plurality of signal lines and can provide a significantly improved signal line density, in addition to providing improved isolation, reduced thermal conductivity, and/or improved scalability. For instance, including flex circuit boards 606 according to example aspects of the present disclosure to couple the classical processors 602 to the quantum hardware 604 can provide for infrastructure that reliably scales to the increasingly greater numbers of qubits that are achieved and/or expected in contemporary and/or future quantum computing systems.

In some embodiments, some or all of the flex circuit board(s) 606 can include at least one ground layer. The ground layer can form an outer surface of the flex circuit board 606, such as an outer surface along the largest surface. In some embodiments, the flex circuit board 606 can include two ground layers, such as two parallel and spaced apart ground layers. For instance, the two ground layers can form both largest outer surfaces of the flex circuit board 606. A ground layer can act as an electrical isolation layer to isolate signal lines on one side of the ground layer from interfering signals (e.g., from signal lines on other layers, other boards, the environment, etc.) on another side of the ground layer. For instance, the ground layer can be coupled to earth ground and/or other suitable ground(s).

The ground layer(s) can be or can include any suitable electrically conductive material. In some embodiments, the ground layer(s) can be or can include superconducting ground layer(s) including superconducting material(s), such as superconducting material(s) that achieve(s) superconductivity at a temperature less than about 3 Kelvin, such as less than about 1 Kelvin, such as less than about 20 milliKelvin. As examples, the ground layer(s) can be or can include niobium, tin, aluminum, molybdenum disulfide, BSCCO, and/or other suitable superconducting materials. Additionally and/or alternatively, the ground layer(s) can be or can include material having high signal transfer performance characteristics, such as low resistance, low reflectivity, low distortion, etc. such that a signal is substantially unchanged by passing through the signal line. As examples, the ground layer(s) can be or can include copper, gold, and/or other suitable materials having high signal transfer performance characteristics. Additionally and/or alternatively, the ground layer(s) can be or can include material(s) having desirable thermal characteristics, such as suitably high and/or low thermal transfer, such as, for example, copper, copper alloy, thin superconducting materials, etc.

In some embodiments, the flex circuit board 606 can include at least one dielectric layer. The dielectric layer(s) can be or can include any suitable dielectric material, such as dielectric polymers. In some embodiments, the dielectric layer(s) can be or can include flexible dielectric material. As one example, the dielectric layer(s) can be or can include polyimide. At least a portion of the dielectric layer(s) can be formed on or otherwise disposed proximate to at least a portion of an inner surface of the ground layer(s). For example, in some embodiments, an inner surface of a ground layer can be mated with an outer surface of a dielectric layer. Furthermore, in some embodiments, inner surfaces of two dielectric layers can be mated with signal lines disposed therebetween.

The flex circuit board 606 can include one or more signal lines. The one or more signal lines can be disposed on a surface (e.g., an inner surface) of at least one dielectric layer. As an example, in some implementations, the one or more signal lines can be disposed between opposing inner surfaces of two dielectric layers. The signal line(s) can be or can include any suitable electrically conductive material. In some embodiments, the signal line(s) can be or can include superconducting signal line(s) including superconducting material(s), such as superconducting material(s) that achieve(s) superconductivity at a temperature less than about 3 Kelvin, such as less than about 1 Kelvin, such as less than about 20 milliKelvin. As examples, the signal line(s) can be or can include niobium, tin, aluminum, molybdenum disulfide, BSCCO, and/or other suitable superconducting materials. Additionally and/or alternatively, the signal line(s) can be or can include material having high signal transfer performance characteristics. As examples, the signal line(s) can be or can include copper, gold, and/or other suitable materials having high signal transfer performance characteristics. Additionally and/or alternatively, the signal line(s) can be or can include material(s) having desirable thermal characteristics, such as, for example, copper, copper alloy, thin superconducting material, etc.

In some embodiments, the flex circuit board 606 can include one or more vias. For instance, the vias can extend through the ground layer(s), the dielectric layer(s), and/or the signal line(s). The vias can serve to improve isolation of the signal lines. In some embodiments, the via(s) can be plated with via plate(s) that extend along the via(s). In some embodiments, the via plate(s) can be or can include conductive material, such as copper.

For instance, in some embodiments, a quantum computing system 600 can include quantum hardware 604 in data communication with one or more classical processor(s) 602. For instance, quantum hardware 604 can represent and/or manipulate information using qubits. A qubit can be or include any suitable quantum device that enables the superposition of multiple states, e.g., both the "0" and "1" state.

As one example, a qubit can be or include a unit of superconducting material, such as superconducting material that achieves superconductivity at a temperature less than about 3 Kelvin, such as less than about 1 Kelvin, such as less than about 20 milliKelvin. In some embodiments, the quantum computing system 600 can include one or more multi-level quantum subsystems, such as a register of qubits. In some implementations, the multi-level quantum subsystems can include superconducting qubits, such as flux qubits, charge qubits, transmon qubits, gmon qubits, etc.

The classical processor(s) 602 can be binary processors, such as processors that operate on data represented as a plurality of bits. As one example, bits can be represented by a voltage differential between a low voltage (e.g., 0V) and a high voltage (e.g., 5V) at a point of reference, such as a memory cell, circuit node, etc. The low voltage can be associated with a "0" state and the high voltage can be associated with a "1" state. The classical processor(s) 602 can be configured to, in addition to any other suitable function(s) of the classical processor(s) 602, control the quantum hardware 604. For instance, the classical processor(s) 602 can be coupled to the quantum hardware 604 (e.g., by signal lines included in flex circuit boards 606 according to example aspects of the present disclosure) and/or configured to send control signals to perform quantum operations using the quantum hardware 604. As one example, the classical processor(s) 602 can be configured to send control signals that implement quantum gate operations at the quantum hardware 604 (e.g., by control device(s)). Additionally and/or alternatively, the classical processor(s) 602 can be configured to send control signals that cause the quantum hardware 604 to perform quantum state measurements and/or provide the quantum state measurements to the classical processor(s) 602 (e.g., by readout device(s)). For example, the classical processor(s) 602 can receive measurements of the quantum system that can be interpretable by the classical processor(s) 602.

According to example aspects of the present disclosure, the quantum computing system 600 can include one or more flex circuit boards 606 including one or more signal lines. The classical processor(s) 602 can be coupled to at least one first flex circuit board. For instance, the classical processor(s) 602 can be coupled to the first flex circuit board(s) 614 by a classical-flex interconnect 632. The classical-flex interconnect 632 can convert from a classical signal transmission medium (e.g., a coaxial cable) 612 to the first flex circuit board(s) 614.

As one example, the classical-flex interconnect 632 can be or can include a compression interposer. The compression interposer can include an array (e.g., a two-dimensional array) of spring pads. A connector receiving signals from the classical processor(s) 602, such as via one or more coaxial cables 612 (e.g., one coaxial cable 612 per signal line) can be compressed against the compression interposer to form signal communications between the spring pads and the connector (e.g., the coaxial cables). The spring pads can each be coupled to a signal line on the first flex circuit board 614 such that signals can be transmitted from the classical processor(s) 602 (e.g., the coaxial cables) to the signal lines. The compression interposer can provide for connecting signal transmission media 612 having a relatively lower spatial density, such as coaxial cables, which may occupy a relatively larger amount of space per cable, to signal transmission media having a relatively higher spatial density, such as signal lines embedded in a first flex circuit board 614 provided according to example aspects of the present disclosure. Additionally, the compression interposer can achieve high isolation between signal lines and/or low reflectivity along a signal line that is/are suitable for quantum computing applications.

In some embodiments, the first flex circuit board(s) 614 can be or can include a first flex circuit board material at the ground layer(s) and/or the signal line(s). The first flex circuit board material can be selected to provide high signal transfer performance characteristics. As examples, the first flex circuit board material can be or can include copper, brass, gold, and/or other suitable materials having high signal transfer performance characteristics. For instance, the first flex circuit board(s) 614 can include copper signal lines and/or ground layer(s) to provide high signal transfer performance characteristics.

The first flex circuit board(s) 614 can pass through a hermetic seal 652 positioned at an end (e.g., an entrance) of the vacuum chamber, such as cap 607. For example, a flex circuit board (e.g., first flex circuit board 614) can be configured to pass through the hermetic seal 652 such that a first portion of the flex circuit board (e.g., first flex circuit board 614) is disposed in the vacuum chamber and a second portion of the flex circuit board (e.g., first flex circuit board 614) is disposed outside of the vacuum chamber while the hermetic seal 652 forms a vacuum seal for the vacuum chamber. The hermetic seal 652 can provide for the first flex circuit board(s) 614 to enter the vacuum chamber without (e.g., substantially) destroying a vacuum created by the vacuum chamber. As one example, the hermetic seal 652 can include a fitted seal for each first flex circuit board 614. The fitted seal(s) can receive the first flex circuit board(s) 614 and form a vacuum seal with surface(s) of the first flex circuit board(s) 614. Additionally, the hermetic seal 652 can include one or more seal slots configured to receive the fitted seal(s) and/or the first flex circuit board(s) 614. For example, the fitted seal(s) can form a vacuum seal with the seal slot(s) while allowing the first flex circuit board(s) 614 to pass through the seal slot(s) and into the vacuum chamber. In this way, the flex circuit board(s) 606 can enter the vacuum chamber without experiencing signal disruptions from breaks in the circuit boards, as the boards can continuously pass into the vacuum chamber. In some embodiments, the hermetic seal 652 can include fastening systems to secure the fitted seals to the seal slots and/or form a vacuum seal, such as, for example, screws, bolts, seal rings, O rings, etc. In some embodiments, the hermetic seal 652 can form a vacuum seal without requiring adhesive material (e.g., glue, resin, etc.) such that, for example, residual adhesive material does not contaminate the flex circuit boards 606.

The first flex circuit board(s) 614 can be coupled to at least one second flex circuit board(s) 616. The first flex circuit board(s) 614 can be coupled to the second flex circuit board(s) 616 by at least one flex-flex interconnect 634. For instance, the flex-flex interconnect(s) 634 can couple (structurally and/or electrically) the ground layer(s), dielectric layer(s), and/or signal line(s) of a first flex circuit board 614 to a second flex circuit board 616. As examples, the flex-flex interconnect(s) 634 can be formed by soldering, welding, and/or otherwise fusing components of a first flex circuit board 614 to a second flex circuit board 616. The flex-flex interconnect(s) 634 can be or can include any suitable interconnection of two flex circuit board(s) 606 such as, for example, a butt joint, an overlap joint, and/or any other suitable interconnection(s). For instance, example flex-flex interconnects that may be employed according to example aspects of the present disclosure is illustrated in FIG. 1.

The second flex circuit board(s) 616 can have at least a different material composition from the first flex circuit board(s) 614. In some embodiments, the second flex circuit board(s) 616 can be or can include a second flex circuit board material at the ground layer(s) and/or the signal line(s). The second flex circuit board material can be selected to provide high signal transfer performance characteristics and/or reduced thermal conductivity. As examples, the second flex circuit board material can be or can include a copper alloy and/or other suitable materials having desirable thermal characteristics. For instance, the second flex circuit board(s) 616 can include copper alloy signal lines and/or ground layer(s) to provide reduced thermal conductivity from the upper portions of the vacuum chamber (e.g., first circuit boards 614) and/or dispelling heat produced at subsequent components, such as surface mount attenuators 654.

In some embodiments, the second flex circuit board(s) 616 can be coupled to at least one surface mount attenuator board 618. For instance, the second flex circuit board(s) 616 can be coupled to the surface mount attenuator board(s) 618 by at least one flex-flex interconnect 636. For instance, the flex-flex interconnect(s) 636 can couple (structurally and/or electrically) the ground layer(s), dielectric layer(s), and/or signal line(s) of a second flex circuit board 616 to a surface mount attenuator board 618. As examples, the flex-flex interconnect(s) 636 can be formed by soldering, welding, and/or otherwise fusing components of a second flex circuit board 616 to a surface mount attenuator board 618. The flex-flex interconnect(s) 636 can be or can include any suitable interconnection of two flex circuit board(s) 606 such as, for example, a butt joint, an overlap joint, and/or any other suitable interconnection(s). For instance, example flex-flex interconnects that may be employed according to example aspects of the present disclosure is illustrated in FIG. 1.

The surface mount attenuator board 618 can be a flexible printed circuit board. In some embodiments, the surface mount attenuator board(s) 618 can be or can include a surface mount attenuator board material at the ground layer(s) and/or the signal line(s). The surface mount attenuator board material can be selected to provide high signal transfer performance characteristics. As examples, the surface mount attenuator board material can be or can include copper, brass, gold, and/or other suitable materials having high signal transfer performance characteristics. For instance, the surface mount attenuator board can include copper signal lines and/or ground layer(s) to provide high signal transfer performance characteristics.

The surface mount attenuator board(s) 618 can include one or more surface mount attenuators 654. The surface mount attenuator(s) 654 can be configured to attenuate or block thermal photon interference. In some embodiments, the surface mount attenuator board(s) 618 and/or the surface mount attenuator(s) 654 can be placed at a temperature cold enough such that the surface mount attenuator(s) 654 do not produce thermal photons. In some embodiments, the surface mount attenuator(s) 654 can be disposed in an isolation plate. The isolation plate can be configured to isolate the one or more surface mount attenuators. The isolation plate can be attached to the surface mount attenuator board(s) 618. In some embodiments, the isolate plate can be mounted to a ground layer and/or grounded. The isolation plate can include one or more cavities configured to isolate a first surface mount attenuator from a second surface mount attenuator. For example, the cavities can surround the first surface mount attenuator in a direction of a second surface mount attenuator and block cross-talk between attenuators.

The quantum computing system 600 can include at least one third flex circuit board 620. For instance, the surface mount attenuator board(s) 618 can be coupled to the third flex circuit board(s) 620 by at least one flex-flex interconnect 638. For instance, the flex-flex interconnect(s) 638 can couple (structurally and/or electrically) the ground layer(s), dielectric layer(s), and/or signal line(s) of a surface mount attenuator board 618 to a third flex circuit board 620. As examples, the flex-flex interconnect(s) 638 can be formed by soldering, welding, and/or otherwise fusing components of a surface mount attenuator board 618 to a third flex circuit board 620. The flex-flex interconnect(s) 638 can be or can include any suitable interconnection of two flex circuit board(s) 606 such as, for example, a butt joint, an overlap joint, and/or any other suitable interconnection(s). For instance, example flex-flex interconnects that may be employed according to example aspects of the present disclosure is illustrated in FIG. 1.

The third flex circuit board(s) 620 can be positioned at a point in the vacuum chamber at which the cooling gradient is cool enough such that some materials exhibit superconductivity. For example, at least a portion of the third flex circuit board(s) 620 can have a temperature of less than about 3 Kelvin.

In some embodiments, the third flex circuit board(s) 620 can be or can include a third flex circuit board material at the ground layer(s) and/or the signal line(s). The third flex circuit board(s) 620 material can be selected to be superconducting at a temperature which at least a portion of the third flex circuit board(s) 620 experiences superconductivity. As examples, the third flex circuit board(s) 620 material can be or can include niobium, tin, aluminum, and/or other suitable superconducting materials. For instance, the third flex circuit board(s) 620 can include copper-plated niobium signal lines and/or ground layer(s) to provide superconductivity. For instance, the copper plating on the copper-plated niobium board(s) can be useful in interfacing with the superconducting niobium, which can provide for improved signal transfer characteristics. In some embodiments, the copper-plated niobium board(s) can be formed by first applying a layer of niobium, followed by a thin layer of copper to prevent the formation of oxides, then a thicker layer of copper.

In some embodiments, the third flex circuit board(s) 620 can be coupled to at least one fourth flex circuit board 622. The third flex circuit board(s) 620 can be coupled to the fourth flex circuit board(s) 622 by at least one flex-flex interconnect 640. For instance, the flex-flex interconnect(s) 640 can couple (structurally and/or electrically) the ground layer(s), dielectric layer(s), and/or signal line(s) of a third flex circuit board 620 to a fourth flex circuit board 622. As examples, the flex-flex interconnect(s) 640 can be formed by soldering, welding, and/or otherwise fusing components of a third flex circuit board 620 to a fourth flex circuit board 622. The flex-flex interconnect(s) 640 can be or can include any suitable interconnection of two flex circuit board(s) 606 such as, for example, a butt joint, an overlap joint, and/or any other suitable interconnection(s). For instance, example flex-flex interconnects that may be employed according to example aspects of the present disclosure is illustrated in FIG. 1.

The fourth flex circuit board(s) 622 can couple the third flex circuit board(s) 620 to the quantum hardware 604. For example, a connector 642 at an end of the fourth flex circuit board(s) 622 can attach to a port that is in signal communication with the quantum hardware 604. As one example, the connector can be a T-joint connector, such as a T-joint connector including superconducting materials (e.g., tin). Additionally and/or alternatively, the connector 642 may be a planar spring array.

In some embodiments, the fourth flex circuit board(s) 622 can be or can include a fourth flex circuit board material at the ground layer(s) and/or the signal line(s). The fourth flex circuit board(s) 622 material can be selected to provide high signal transfer performance characteristics. As examples, the fourth flex circuit board(s) 622 material can be or can include copper, brass, gold, and/or other suitable materials having high signal transfer performance characteristics. For instance, the fourth flex circuit board(s) 622 can include copper signal lines and/or ground layer(s) to provide high signal transfer performance characteristics. Additionally and/or alternatively, the fourth flex circuit board(s) 622 material can be selected to be superconducting at temperature which at least a portion of the fourth flex circuit board(s) 622 experience. As examples, the fourth flex circuit board(s) 622 material can be or can include niobium, tin, aluminum, and/or other suitable superconducting materials.

In some embodiments, the fourth flex circuit board(s) 622 can be or can include a filter 656, such as an XYZ and/or IR filter 656. For instance, the filter 656 can be configured to reduce effects of noise, thermal photons, and/or other potential sources of interference. As one example, the filter 656 can include a cavity in the fourth flex circuit board(s) 622 that is filled with a filter material, such as a particulate suspension, to provide XYZ/IR filtering. In some examples, the filter material can provide less attenuation to signals of a first frequency and greater attenuation to signals of a second, higher frequency. For instance, some filter materials provide attenuation that increases in a substantially monotonic fashion with increasing signal frequency for at least a portion of a targeted frequency band. In some embodiments, aspects of the filter material can be configured for lowpass and/or bandpass operation.

In some embodiments, the filter 656 can be bounded by one or more boundaries of a cavity within the fourth flex circuit board(s) 622 (e.g., a cavity within the dielectric material). For instance, a cavity within the fourth flex circuit board(s) 622 can be filled with a filter material (e.g., a magnetically loaded polymer). In some embodiments, the cavity can be filled (e.g., partially or completely) with filter material via an access within the fourth flex circuit board(s) 622 when the filter material is in any pourable, injectable, and/or moldable state (e.g., flowing particulates, soft/plasticized materials, gels, slurries, pastes, foams, uncured thermosets, softened/melted thermoplastics, etc.). In some embodiments, the cavity can be filled with the filter material in a substantially solid state (e.g., by press-fitting into the cavity, etc.).

In an example, control pulses may be transmitted over one or more signal lines. (e.g., signal line(s) 116, 126) For example, a control pulse can be transmitted by one or more classical processors coupled to the signal line(s). The control pulse can be or can include classical (e.g., binary) computer-readable signal data, such as a voltage signal, and/or signals that are implementable by quantum computing devices.

In an example, a control pulse is transmitted to one or more quantum computing devices via signal line(s) For example, the control pulse can be transmitted, by the signal line(s), through a plurality of cryogenic cooling stages. For instance, signal line(s) carrying the control pulse can be progressively decreasing in temperature from the classical processor(s) (e.g., at room temperature and/or a temperature on the order of about 100 Kelvin) to the quantum computing device(s) (e.g., at a temperature less than about 3 Kelvin, such as less than about 1 Kelvin, such as less than about 20 milliKelvin) and through a plurality of cryogenic cooling stages.

In an example, a control pulse may be applied to perform at least one quantum operation based at least in part on a control pulse. As one example, in some embodiments, quantum operation(s) can be or can include obtaining state measurement(s) of the quantum computing device(s). For instance, a control pulse can instruct the quantum computing device(s) to measure a quantum state and/or resolve the quantum state to a basis state representation. Additionally, the measured quantum state can be transmitted (e.g., by signal lines) to the classical processor(s).

As another example, in some embodiments, the quantum operation(s) can be or can include implementing at least one quantum gate operation by and/or at the quantum computing device(s). For instance, the control pulse can be descriptive of microwave pulses that are applied to the quantum computing device(s) (e.g., qubits) to perform quantum gating operations. Example quantum gating operations include, but are not limited to, Hadamard gates, controlled-NOT (CNOT) gates, controlled-phase gates, T gates, multi-qubit quantum gates, coupler quantum gates, etc.

Implementations of the digital and/or quantum subject matter and the digital functional operations and quantum operations described in this specification can be implemented in digital electronic circuitry, suitable quantum circuitry or, more generally, quantum computational systems, in tangibly-implemented digital and/or quantum computer software or firmware, in digital and/or quantum computer hardware, including the structures disclosed in this specification and their structural equivalents, or in combinations of one or more of them. The term "quantum computing systems" may include, but is not limited to, quantum computers/computing systems, quantum information processing systems, quantum cryptography systems, or quantum simulators.

Implementations of the digital and/or quantum subject matter described in this disclosure can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits/qubit structures, or a combination of one or more of them. Alternatively or in addition, the program instructions can be encoded on an artificially-generated propagated signal that is capable of encoding digital and/or quantum information (e.g., a machine-generated electrical, optical, or electromagnetic signal) that is generated to encode digital and/or quantum information for transmission to suitable receiver apparatus for execution by a data processing apparatus.

The terms quantum information and quantum data refer to information or data that is carried by, held, or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states (e.g., qudits) are possible.

The term "data processing apparatus" generally refers to digital and/or quantum data processing hardware and encompasses all kinds of apparatuses, devices, and machines for processing digital and/or quantum data, including by way of example a programmable digital processor, a programmable quantum processor, a digital computer, a quantum computer, or multiple digital and quantum processors or computers, and combinations thereof. The apparatus can also be, or further include, special purpose logic circuitry, e.g., an FPGA (field programmable gate array), or an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., Quantum Computation Language (QCL), Quipper, Cirq, etc.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers or processors to be "configured to" or "operable to" perform particular operations or actions means that the system has installed on it software, firmware, hardware, or a combination of such that in operation cause the system to perform the operations or actions. For one or more digital and/or quantum computer programs to be configured to perform particular operations or actions means that the one or more programs include instructions that, when executed by digital and/or quantum data processing apparatuses, cause such apparatuses to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum microprocessors or both, or any other kind of central digital and/or quantum processing unit. Generally, a central digital and/or quantum processing unit will receive instructions and digital and/or quantum data from a read-only memory, or a random access memory, or quantum systems suitable for transmitting quantum data, e.g. photons, or combinations thereof.

Some example elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, or optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or electronic system that may include one or more digital and/or quantum processing devices and memory to store executable instructions to perform the operations described in this specification.

While this disclosure contains many example implementation details, these should not be construed as limitations on the scope of what may be claimed, but rather as descriptions of features that may be specific to particular implementations. Certain features that are described in examples of this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A circuit structure comprising:
   a first circuit board comprising a plurality of first superconducting signal lines;
   a second circuit board comprising a plurality of second superconducting signal lines; and
   a joint that physically couples the first circuit board and the second circuit board and electrically couples each first superconducting signal line of the plurality of first superconducting signal lines of the first circuit board with a corresponding second superconducting signal line of the plurality of second superconducting signal lines of the second circuit board;
   wherein the joint comprises a plurality of signal pad structures positioned in the joint in a staggered formation;
   wherein the joint electrically couples each first superconducting signal line with each corresponding second superconducting signal line by a corresponding signal pad structure of the plurality of signal pad structures electrically coupling the first superconducting signal line and second superconducting signal line;
   wherein the first circuit board further comprises a first side and a second side opposite of the first side, the second circuit board further comprising a third side and a fourth side opposite the third side, and at the joint, a portion of the second side of the first circuit board overlaps a portion of the third side of the second circuit board; and
   wherein the first circuit board further comprises a first dielectric layer and a plurality of first vias each extending through the first dielectric layer at least from a corresponding first superconducting signal line of the first plurality of superconducting signal lines to the second side of the first circuit board and the second circuit board further comprises a second dielectric layer and a plurality of second vias each extending through the second dielectric layer at least from a corresponding second superconducting signal line of the plurality of second superconducting signal lines to the third side of the second circuit board.

2. The circuit structure of claim 1, wherein the circuit structure is a flexible circuit structure, the first circuit board is a first flexible circuit board, and the second circuit board is a second flexible circuit board.

3. The circuit structure of claim 1, wherein the staggered formation comprises:
   a first row comprising two or more first-row signal pad structures aligned in a first direction; and
   a second row comprising two or more second-row signal pad structures aligned in the first direction, wherein the first-row signal pad structures are not aligned with the second-row signal pad structures in a second direction orthogonal to the first direction.

4. The circuit structure of claim 1, wherein the joint is an overlap joint in which a portion of the first circuit board overlaps a portion of the second circuit board.

5. The circuit structure of claim 1, wherein each of the first superconducting signal lines of the first circuit board and the second superconducting signal lines of the second circuit board comprise a superconducting material that achieves superconductivity at a temperature less than 3 Kelvin.

6. The circuit structure of claim 1, wherein the plurality of signal pad structures are positioned in the joint between the second side of the first circuit board and the third side of the second circuit board.

7. The circuit structure of claim 6, wherein the joint electrically couples each first superconducting signal line and each corresponding second superconducting signal line by the signal pad structure electrically coupling each first via of the plurality of first vias of the first circuit board with a corresponding second via of the second plurality of vias of the second circuit board.

8. The circuit structure of claim 1, wherein at least one first via of the first circuit board and at least one corresponding second via of the second circuit board are offset in the joint.

9. The circuit structure of claim 1, wherein the first circuit board further comprises a plurality of first signal pads that are each electrically coupled to a corresponding first via, the second circuit board further comprises a plurality of second signal pads that are each electrically coupled to a corresponding second via, and the joint further comprises solder that electrically and physically couples each first signal pad of the first circuit board to a corresponding second signal pad.

10. The circuit structure of claim 9, wherein the first signal pads and the second signal pads each have a circular structure.

11. The circuit structure of claim 9, further comprising a plurality of pluralities of ground pads, each plurality of ground pads disposed at least partially around a corresponding first signal pad.

12. The circuit structure of claim 9, wherein the first circuit board further comprises a first ground layer and a second ground layer, the second circuit board further comprises a third ground layer and a fourth ground layer, and the joint further comprises one or more solder connections that electrically couples the second ground layer of the first circuit board and the third ground layer of the second circuit board.

13. The circuit structure of claim 9, wherein:
the plurality of first signal pads is arranged in a first staggered formation;
the plurality of second signal pads is arranged in a second staggered formation; and
the first staggered formation is a mirror image of the second staggered formation.

14. The circuit structure of claim 1, wherein at least one first via of the first circuit board extends from the second side of the first circuit board through to the first side of the first circuit board and at least one second via of the second circuit board extends from the fourth side of the second circuit board through to the third side of the second circuit board.

15. The circuit structure of claim 1, wherein the plurality of first vias of the first circuit board and the plurality of second vias of the second circuit board do not overlap in the joint.

16. The circuit structure of claim 1, wherein the plurality of first superconducting signal lines and the plurality of second superconducting signal lines comprise niobium, tin, aluminum, molybdenum disulfide, or bismuth strontium calcium copper oxide (BSCCO).

17. A method for producing a circuit structure comprising an overlap joint, comprising:
obtaining a first circuit board comprising a plurality of first superconducting signal lines electrically coupled to a first plurality of signal pads, the first plurality of signal pads being arranged in a first staggered formation;
obtaining a second circuit board comprising a plurality of second superconducting signal lines electrically coupled to a second plurality of signal pads, the second plurality of signal pads being arranged in a second staggered formation;
aligning the first circuit board and the second circuit board such that the first plurality of signal pads of the first circuit board is aligned with the second plurality of signal pads of the second circuit board; and
electrically coupling each signal pad of the first plurality of signal pads of the first circuit board with a corresponding signal pad of the second plurality of signal pads of the second circuit board; wherein:
the first circuit board is a first flexible circuit board that further comprises a first side, a second side that opposes the first side, a first dielectric layer, and a first via extending through the first dielectric at least from at least one first superconducting signal line of the plurality of first superconducting signal lines to the second side of the first flex circuit board;
the second circuit board is a second flexible circuit board that further comprises a third side, a fourth side that opposes the third side, a second dielectric layer, and a second via extending through the second dielectric at least from at least one second superconducting signal line of the plurality of second superconducting signal lines to the third side of the second flex circuit board; and
the at least one first superconducting line and the at least one second superconducting line comprise a superconducting material that achieves superconductivity at a temperature of less than about 3 Kelvin, and the method further comprises:
aligning the first flex circuit board and the second flex circuit board such that at least one signal pad of the first plurality of signal pads is positioned in a first overlap joint between the second side of the first flex circuit board and the third side of the second flex circuit board; and
coupling the at least the first via and at least the second via at the at least one signal pad such that the first via and the second via are offset.

18. The method of claim 17, wherein:
the first circuit board comprises a plurality of pluralities of ground pads, each plurality of ground pads disposed at least partially around a corresponding signal pad of the first plurality of signal pads.

* * * * *